United States Patent

Suzuki et al.

[11] Patent Number: 4,848,814
[45] Date of Patent: Jul. 18, 1989

[54] WAFER TRANSFER HAND

[75] Inventors: Takeo Suzuki, Kitakyushu; Junpei Yuyama, Chigasaki, both of Japan

[73] Assignees: Nihon Shinku Gijutsu Kabushiki Kaisha, Chigasaki; Kabushiki Kaisha Yaskawa Denki Seisakusho, Kitakyushu, both of Japan

[21] Appl. No.: 112,964

[22] Filed: Oct. 27, 1987

[30] Foreign Application Priority Data

Oct. 31, 1986 [JP] Japan .............. 61-167515[U]

[51] Int. Cl.⁴ .................................. A47F 13/06
[52] U.S. Cl. ............................... 294/1.1; 294/6; 294/27.1; 29/759; 901/30
[58] Field of Search ............... 294/1.1, 6, 27.1, 33, 294/64.1, 99.1; 269/152, 254 R, 902, 903; 211/41, 89; 248/903

[56] References Cited

U.S. PATENT DOCUMENTS

| | | | |
|---|---|---|---|
| 3,044,097 | 7/1962 | Proschold | 294/6 X |
| 3,219,375 | 11/1965 | Van Pelt | 294/33 X |
| 3,918,756 | 11/1975 | Saville et al. | 294/33 X |
| 3,961,819 | 6/1976 | Yocum | 294/6 X |
| 4,452,480 | 6/1984 | Maier et al. | 294/27.1 X |
| 4,496,180 | 1/1985 | Hillman et al. | 294/64.1 |
| 4,653,636 | 3/1987 | Armstrong | 211/41 X |

Primary Examiner—Johnny D. Cherry
Assistant Examiner—Gary C. Hoge
Attorney, Agent, or Firm—Beveridge, DeGrandi & Weilacher

[57] ABSTRACT

A wafer transferring hand is so constructed that at least three seats made of a soft low-friction material are provided in an integral manner, a groove having a width slightly wider than the thickness of the wafer is formed in the laterally arranged seats, the bottom of the groove being arcuated in a manner conforming to the periphery of the wafer, while a similar groove having an adjustable width is provided in the seat arranged at the center, the bottom of the groove being spaced apart outwardly from the periphery of the wafer, and at least two cut-away portions are provided between the seats so as to provide a gap between the periphery of the wafer and the bottom of the cut-away portion.

4 Claims, 5 Drawing Sheets

FIG. I(a)
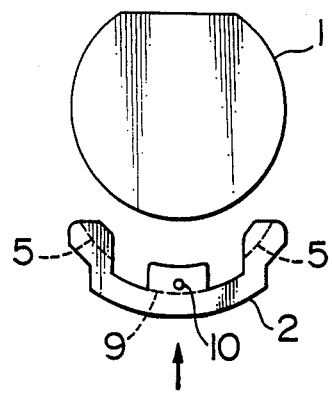
FIG. I(b)
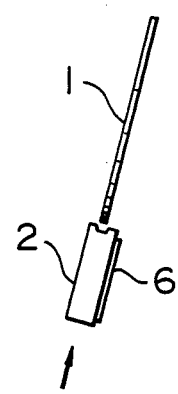
FIG. I(c)
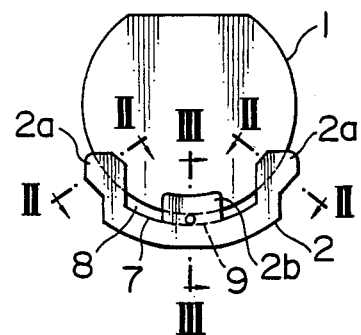
FIG. I(d)
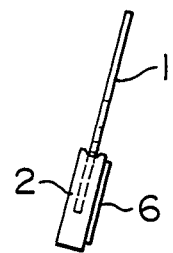

WAFER TRANSFER HAND

BACKGROUND OF THE INVENTION

This invention relates to a wafer transfer hand to be used for handling wafers in a semiconductor producing apparatus which is operated in, for instance, a clean room or a vacuum chamber.

A conventional construction of the wafer transfer hand is illustrated in FIGS. 6(a) and 6(b) of the attached drawings. In the shown construction, a hand 20 made of aluminum and operable for transferring a wafer 1 is formed into an arcuate configuration conforming to the circumference of the wafer 1. The hand 20 has a groove 30 adapted to receive a peripheral portion of the wafer 1 which is to be transferred by the nand 20 when it is operated. More specifically, the conventional hand 20 does not seize the wafer 1 firmly, but it simply picks up the wafer 1, while the wafer is loosely received in the groove 30, so that the direct contact of the hand 20 with the principal surface of the wafer 1 can be avoided as far as possible.

The above described construction of the conventional wafer transfer hand, however, is found to be disadvantageous in the following points:

(1) The aluminum made hand 20 tends to create vibration and noise when it supports a hard wafer, and attenuation of the vibration is not sufficient.

(2) Since a marginal gap is required between the wafer 1 and the internal surface of the groove 30, such a gap tends to cause an additional inclination of the wafer 1 according to the disposition of the groove 30. FIGS. 7(a) through 7(c) illustrate such arrangements. In the drawing, it is assumed that d represents the thickness of the wafer 1, l represents the width of the hand 20, and l' represents the width of the groove 30. As a consequence, the gap is expressed by l'-d, and in a case where the disposition of the groove 30 is vertical, the wafe 1 is inclined to an arbitrary side of the groove 30. FIGS. 7(a) and 7(b) illustrate leftward and rightward dispositions. In a case where the groove 30 is beforehand tilted rightwardly as shown in FIG. 7(c), owing to a gravitational force W, the wafer 1 is further tilted rightwardly. That is, the degree of inclination L of the wafer 1 becomes larger than l. Accordingly, an end of the wafer 1 projects over the width l of the hand 20 supporting the wafer 1, thereby exhibiting a difficulty in a case where the wafer 1 is transferred through a narrow passage. Furthermore, any deviation in the inclination of the wafer tends to invite mishandling of the wafer during the transferring operation, thus making it difficult to obtain a constant locus during the wafer transferring operation.

(3) In a case where a marginal error exists in the arc 1a defining the periphery of the wafer 1, or where the center line 1c of the wafer 1 does not coincide with the center line 20c of the hand 20 as shown in FIG. 8(a), a forward edge 20a of the hand 20 is brought into abutment in the direction of an arrow mark U of FIG. 8(b) against the wafer 1 which is provided at a separated position from the center line 20c, thereby rotating the wafer 1 around the center as indicated by an arrow mark R in FIG. 8(b). The rotation of the wafer 1, varies the orientation of the wafer 1 and causes disadvantages in the subsequent processes.

SUMMARY OF THE INVENTION

An object of the invention is to provide a wafer transferring hand wherein the above described difficulties of the conventional construction can be substantially eliminated.

Another object of the invention is to provide a wafer transferring hand which can transfer the wafer in a stable manner.

Still another object of the invention is to provide a wafer transferring hand which is simple in construction and economical in production.

These and other objects of the invention can be achieved by a wafer transferring hand constructed such that the hand comprises at least three seats formed in an integral manner by use of a soft low-friction material, a groove having a width slightly wider than the thickness of the wafer is formed in each of the laterally arranged seats, the bottom of the groove being arcuated in a manner conforming to the periphery of the wafer received on the seat, while a similar groove having an adjustable width is formed in the seat provided at the center of the hand, the bottom of the groove also arcuated being spaced apart outwardly from the periphery of the wafer which is received on the seat, and at least two cut-away portions are provided between the aforementioned seats so as to maintain a gap between the periphery of the wafer and the bottom of each cut-away portion.

BRIEF DESCRIPTION OF THE DRAWINGS

In the drawings:

FIGS. 1(a) through 1(d) are plan views and elevational views of an embodiment of the invention before and after the insertion of a wafer;

DESCRIPTION OF THE PREFERRED EMBODIMENT

Figure 2:
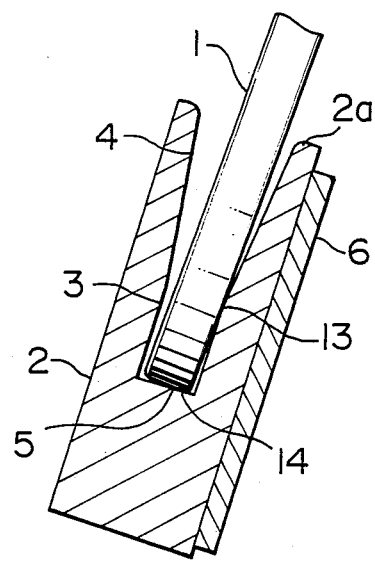
FIG. 2 is a cross-sectional view taken along the line II—II in FIG. 1(c)

A preferred embodiment of the present invention will now be described with reference to FIGS. 1(a) through 1(d) and FIGS. 2 and 3.

In FIG. 1(a) through 1(d), a wafer 1 is supported by a suitable means at an inclined angle of, for instance, 15° so that the wafer may be scooped by a hand 2 secured to an automatic device (not shown) from a lower position upwardly. The hand 2 is made of a material such as Teflon polytetrafluroethylene polymer having a specific gravity and a frictional coefficient comparatively low and highly soft and flexible.

The hand 2 comprises two lateral seats 2a and a central seat 2b formed in an integral manner, with cut-away portions 7 formed between the lateral side seats 2a and the central seat 2b.

As shown in FIG. 2 illustrating a cross-sectional view of each side seat 2a, the seat 2a comprises a groove portion 3 having a width slightly larger than the thickness of the wafer 1 to be received therein, an inclined portion 4 having a width of groove increasing toward outside, and a bottom portion 5 formed into an arc conforming to the outer circumference of the wafer 1. A reinforcing plate 6 of a configuration adapted to that of the hand 2 is bonded to a lower side surface of the hand 2 for preventing the hand made of Teflon polytetrafluroethylene polymer from being bent by the weight W of the wafer 1.

Figure 3:
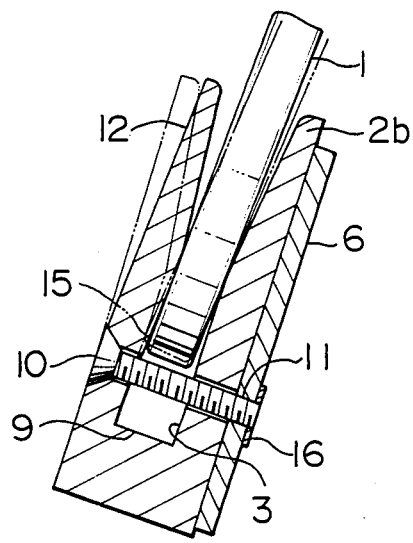
FIG. 3 is a cross-sectional elevation view taken along the line III—III in FIG. 1(c)

FIG. 3 is a cross-sectional view showing the central seat 2b, sectioned along the line III—III in FIG. 1(c). As in the case of the cut-away portion 7 wherein a gap 8 is provided between its bottom and the wafer 1, a bottom portion 9 of the central seat 2b is spaced apart by a gap from the circumference of the wafer 1 when the wafer 1 is received on the seat 2b. A counter-sunk screw 10 is extended through a groove portion 3 from the front side to the rear side of the central seat 2b in a manner not touching either the wafer 1 or the bottom portion 9. Through holes are provided through the seat 2b for passing the screw 10, while a tapped hole 11 is provided through the reinforcing plate 6. When the screw 10 is driven into the tapped hole 11, a frame 12 formed on the side of the groove of the central seat 2b not provided with the reinforcing plate 6 is bent in a direction narrowing the opening of the groove. A lock nut or washer 16 is further provided for preventing loosening of the screw 10 after the screw is once adjusted to a suitable position. The frame 12 of the central seat 2b may otherwise be provided as a separate member without impairing the advantageous feature of the present invention.

The operation of the wafer transferring hand of the invention will now be described.

The wafer 1 and the hand 2 are firstly placed as shown in FIGS. 1(a) and 1(b). When the hand 2 secured to an automatic device is shifted in a direction indicated by an arrow mark in the drawing, since the opening of the groove in the lateral side seats 2a and the central seat 2b is selected to be sufficiently wide, and furthermore since the seats 2a and 2b are made of a soft and flexible material of a low frictional coefficient such as Teflon, polytetrafluroethylene polymer, a smooth guide of the wafer 1 into the seats 2a and 2b is assured regardless of a deviation between the supporting angle of the wafer 1 and the shifting angle of the hand 2, so far as the deviation falls within the opening angle of the inclined portion 4.

According to the upward movement of the hand 2, the circumference of the wafer 1 slides along the inclined portion 4 until it is settled in the groove portion 3.

In this case, since the bottom portion 5 in each of the side seats 2a coincides with the circumference of the wafer 1, the wafer 1 is forced upward when the bottom portion 5 contacts the circumference of the wafter 1. At this time, a moment of force is applied in the inclined direction of the wafer 1, and since the width of the groove portion 3 is slightly wider than the thickness of the wafer 1, the wafer 1 will be further tilted from the preset angle.

However, since the bottom portion 9 of the central seat 2b is selected to be deeper than the circumference of the wafer 1, and furthermore the counter-sunk screw 10 is extended across the groove portion 3, the frame 12 not supported by the reinforcing plate 6 can be bent inward by driving the screw 10 more tightly. Thus the inclination of the wafer 1 can be controlled into a required angle by adjusting the clamping force of the screw 10 in consideration of a fulcrum point 13 for the moment of force and a supporting point 14 for the weight W of the wafer 1, by varing the position of a clamping point 15 slightly. The stress caused by the adjustment in the central seat does not affect the lateral seats 2a because of the presence of the cut-away portions 7 between the central seat 2b and the side seats 2a.

As can be seen in FIG. 1(c), the grooves in the lateral seats have arcuate bottoms which both lie on arcs of one circle, the groove in the center seat has a bottom 9 which is radially outward of said circle, and the bottoms of the cut-away portions 7 are radially outward of said circle.

The wafer transferring hand of this invention can be operated continuously after the screw 10 of the central seat 2b has been once adjusted as described above.

Furthermore, since the distance between both of the lateral seats 2a is selected to be sufficiently wide for supporting the weight W of the wafer 1, the possibility of displacing the wafer 1 in a lateral direction can be substantially eliminated.

Figure 5A:
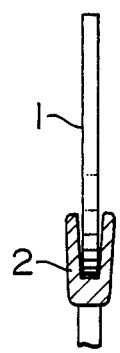
Figure 5B:
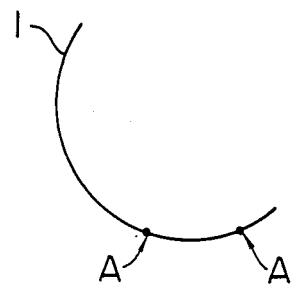
Figure 5C:
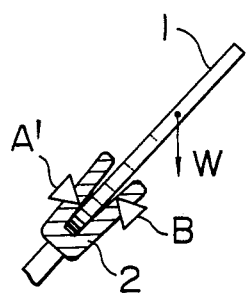
Figure 5D:
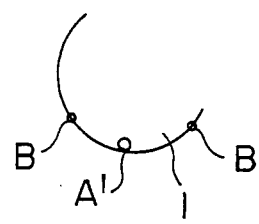
Figure 6A:
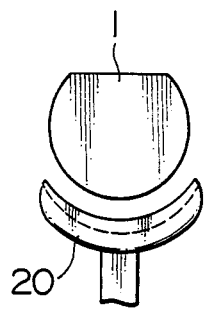
FIGS. 6(a) and 6(b) are a plan view and an elevational view showing a conventional wafer transfer hand.
Figure 6B:
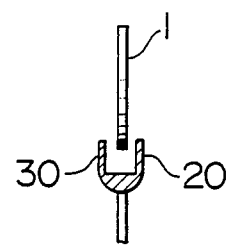
Figure 7A:
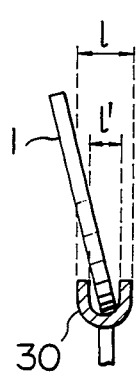
FIGS. 7(a) through 7(c) are diagrams for explaining a disadvantage of the conventional hand.
Figure 7B:
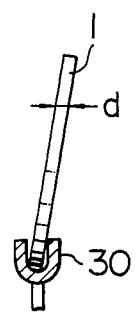
Figure 7C:
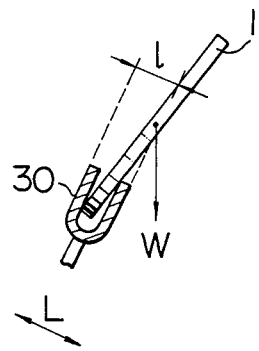
Figure 8A:
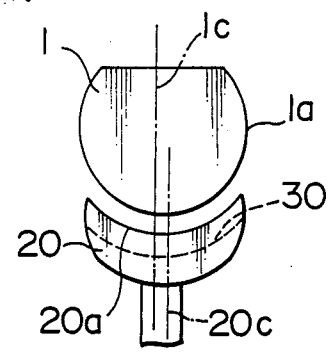
FIGS. 8(a) and 8(b) are diagrams for explaining another disadvantage of the conventional hand.
Figure 8B:
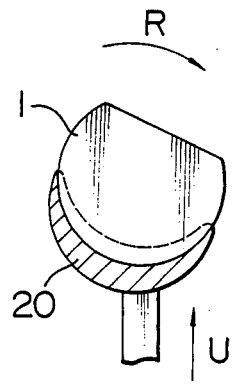

More specifically, in a case where the wafer is transferred while it is held vertical as shown in FIG. 5(a) the weight of the wafer is supported at two positions designated by A in FIG. 5(b). Thus for reducing the possibility of the wafer falling down, it would be advantageous that the wafer be further depressed near the center of the peripheral arc of the wafer as indicated by A' in FIGS. 5(c) and 5(d) which are a profile view and a plan view showing one part of the wafer. That is, the torsional moment caused by the weight of the wafer and acting around the point B (or line B—B) is cancelled by the depressing force acting at the point A', and the correction of the inclination angle according to the disposition of the hand and the adjustment of the allowance can be thereby carried out in a simple manner.

In a case where the wafer placed at a predetermined position is raised by the hand, with a deviation presenting between the center of the wafer and the center of the hand, the displacement of the wafer can be minimized by the above described supporting manner. Conversely, when the wafer is supported in a wholly contacting manner, the wafer will be rotated during the transfer operation owing to a slight vibration of the wafer.

Characteristic features of the present invention are summarized as follows.

(1) Seats supporting the wafer are made of a resilient and low-friction material such as Teflon polytetrafluoroethylene polymer.

(2) The width of a groove formed in the seat provided near a central portion of the wafer periphery is made adjustable.

Figure 4:
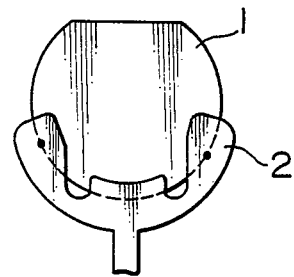
FIGS. 4 and 5(a) through 5(d) are diagrams showing characteristic features of the invention.

(3) When the wafer is supported by the hand, contacting points between the wafer and the bottoms of the grooves formed in the seats are restricted into two positions indicated by heavy dots in FIG. 4. That is, the bottom of the groove formed in the central seat is not contacting with the periphery of the wafer.

According to the present invention, various advantages can be achieved as follows, and therefore it is apparent that the invention can contribute much to the related field of industry.

(1) Since the hand of the invention is made of a resilient and low-friction material such as Teflon polytetrafluroethylene polymer, any possibility of the wafer being thereby damaged can be eliminated substantially, and further advantages of hardly creating dust, not causing vibration and attenuating the vibration in short time when it occurs can be thereby realized.

(2) Since the inclination angle of the wafer can be adjusted, the transferring operation of the wafers through a narrow passage by use of an automatic device can be executed smoothly.

(3) Since the distance between two supporting points for the wafer is selected to be sufficiently wide, there is no possibility of the wafer being rotated by a weak vibration during the transfer, and even in a case where the center of the wafer does not coincide with the center of the hand, the amount of rotation of the wafer can be reduced to a minimum value.

(4) The portion of the wafer contacting with the seats of the hand is restricted to the periphery of the wafer, and hence the wear of the wafer can be minimized.

What is claimed is:

1. A wafer transferring hand characterized in that the hand comprises a center seat and two lateral seats which are formed in an integral manner of a soft low-friction material, each of the lateral seats having a groove so dimensioned as to have a width slightly wider than the thickness of the wafer, the bottom of the groove in the lateral seats being arcuate and dimensioned as to conform to the periphery of the wafer received on the seats, the center seat having a groove which has an adjustable width the bottom of the groove in the center seat being positioned where it is spaced apart outwardly from the periphery of the wafer which is received in the center seat, and at least two cut-away portions are provided between the aforementioned seats, said cutaway portions each having a bottom positioned to provide a gap between the periphery of the wafer and the bottom of each cut-away portion.

2. A wafer transferring hand according to claim 1 wherein a reinforcing member is secured to one side of the central and lateral seats supporting the weight of the wafer when the wafer slightly inclined from its vertical direction is received in and transferred by said hand.

3. A wafer transferring hand according to claim 2 wherein a tapped hole is further provided through the reinforcing member, and a screw means for adjusting the width of the groove, said screw means being driven through a portion of said central seat into said tapped hole of the reinforcing member.

4. A wafer transferring hand according to claim 1 wherein the grooves in the lateral seats have arcuate bottoms which both lie on arcs of one circle, the groove in the center seat having a bottom which is radially outward of said circle, and the bottoms of the cut-away portions are radially outward of said circle.

* * * * *